US007779315B2

(12) United States Patent
Lee et al.

(10) Patent No.: US 7,779,315 B2
(45) Date of Patent: *Aug. 17, 2010

(54) SEMICONDUCTOR MEMORY DEVICE HAVING A SINGLE INPUT TERMINAL TO SELECT A BUFFER AND METHOD OF TESTING THE SAME

(75) Inventors: Seung-Hoon Lee, Gyeonggi-do (KR); Dong-Hak Shin, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 729 days.

This patent is subject to a terminal disclaimer.

(21) Appl. No.: 11/624,651

(22) Filed: Jan. 18, 2007

(65) Prior Publication Data
US 2007/0115736 A1 May 24, 2007

Related U.S. Application Data

(62) Division of application No. 11/004,684, filed on Dec. 3, 2004, now Pat. No. 7,184,324.

(30) Foreign Application Priority Data
Dec. 5, 2003 (KR) ............................... 2003-88109

(51) Int. Cl.
*G11C 29/00* (2006.01)
*G11C 7/00* (2006.01)
(52) U.S. Cl. ........................................ 714/719; 365/201
(58) Field of Classification Search .................. 714/718, 714/719; 365/189.05, 201, 236
See application file for complete search history.

(56) References Cited

U.S. PATENT DOCUMENTS
4,931,722 A * 6/1990 Stoica ......................... 714/733

(Continued)

FOREIGN PATENT DOCUMENTS
EP 324386 A2 * 7/1989

(Continued)

OTHER PUBLICATIONS

"Design and selection of buffers for minimum power-delay product" by Turgis et al. European Design and Test Conference, 1996. ED&TC 96. Proceedings Publication Date: Mar. 11-14, 1996 On pp. 224-228 ISBN: 0-8186-7424-5 INSPEC Accession No. 5309485.*

(Continued)

*Primary Examiner*—Cynthia Britt
(74) *Attorney, Agent, or Firm*—Harness, Dickey & Pierce

(57) ABSTRACT

A semiconductor memory device has a single input terminal to select a buffer and includes input-output terminals, input-output buffers, a memory core, and a buffer selecting unit. The input-output terminals include address input terminals, data input-output terminals and an input terminal to select a buffer. The input-output buffers are coupled to the data input-output terminals respectively. The memory core is coupled to the input-output buffers through input-output lines. The buffer selecting unit generates a parallel buffer select signal based on an expected signal having a pulse stream, wherein the expected signal is provided via the input terminal to select a buffer in a test mode, and applies the parallel buffer select signal to the plurality of input-output buffers to select a corresponding input-output buffer. Hence, the semiconductor memory device may increase efficiency of a pin in a test device.

11 Claims, 9 Drawing Sheets

U.S. PATENT DOCUMENTS

| | | | |
|---|---|---|---|
| 5,706,234 A * | 1/1998 | Pilch et al. | 365/201 |
| 5,740,179 A * | 4/1998 | Dorney et al. | 714/719 |
| 5,852,617 A * | 12/1998 | Mote, Jr. | 714/726 |
| 6,038,182 A | 3/2000 | Hwang | |
| 6,272,053 B1 | 8/2001 | Choi | |
| 6,304,503 B1 | 10/2001 | Akamatsu et al. | |
| 6,479,363 B1 | 11/2002 | Tanimura | |
| 6,483,761 B2 | 11/2002 | Akamatsu et al. | |
| 6,807,109 B2 | 10/2004 | Tomishima | |
| 7,184,324 B2 * | 2/2007 | Lee et al. | 365/189.05 |
| 2002/0069381 A1 * | 6/2002 | Jeong et al. | 714/704 |
| 2008/0106287 A1 * | 5/2008 | Whetsel et al. | 324/754 |

FOREIGN PATENT DOCUMENTS

| | | | |
|---|---|---|---|
| JP | 01043899 A * | 2/1989 | |
| KR | 10-0188016 | 1/1999 | |
| KR | 1999-0068881 | 9/1999 | |
| KR | 2000-0007310 | 2/2000 | |

OTHER PUBLICATIONS

English language abstract of Korean Publication No. 10-0188016.
English language abstract of Korean Publication No. 1999-0068881.
English language abstract of Korean Publication No. 2000-0007310.

* cited by examiner

FIG. 4

| NO | NORMAL | TEST MODE | |
|---|---|---|---|
| | | LOGIC INT | CORE INT |
| 1 | — | TEST MODE | — |
| 2 | — | CS_L | — |
| 3 | — | DIO | — |
| 4 | — | DCK | — |
| 5 | RX7P | BYP_RX_I[15] | BANK ADDR[3] |
| 6 | RX7N | BYP_RX_I[14] | BANK ADDR[2] |
| 7 | RX6P | BYP_RX_I[13] | BANK ADDR[1] |
| 8 | RX6N | BYP_RX_I[12] | BANK ADDR[0] |
| 9 | RX5P | BYP_RX_I[11] | SPARE ADDRESS |
| 10 | RX5N | BYP_RX_I[10] | SPARE ADDRESS |
| 11 | RX4P | BYP_RX_I[9] | ADDR[9] |
| 12 | RX4N | BYP_RX_I[8] | ADDR[8] |
| 13 | RX3P | BYP_RX_I[7] | ADDR[7] |
| 14 | RX3N | BYP_RX_I[6] | ADDR[6] |
| 15 | RX2P | BYP_RX_I[5] | ADDR[5] |
| 16 | RX2N | BYP_RX_I[4] | ADDR[4] |
| 17 | RX1P | BYP_RX_I[3] | ADDR[3] |
| 18 | RX1N | BYP_RX_I[2] | ADDR[2] |
| 19 | RX0P | BYP_RX_I[1] | ADDR[1] |
| 20 | RX0N | BYP_RX_I[0] | ADDR[0] |
| 21 | TX7P | BYP_TX_I[15] | SPARE |
| 22 | TX7N | BYP_TX_I[14] | MDO, PSSC CONTROL |
| 23 | TX6P | BYP_TX_I[13] | SPARE DQ[7] |
| 24 | TX6N | BYP_TX_I[12] | SPARE DQ[6] |
| 25 | TX5P | BYP_TX_I[11] | PRECH |
| 26 | TX5N | BYP_TX_I[10] | WRITE |
| 27 | TX4P | BYP_TX_I[9] | SPARE DQ[5] |
| 28 | TX4N | BYP_TX_I[8] | SPARE DQ[4] |
| 29 | TX3P | BYP_TX_I[7] | COLCYC |
| 30 | TX3N | BYP_TX_I[6] | COLLAT |
| 31 | TX2P | BYP_TX_I[5] | DQ[3] |
| 32 | TX2N | BYP_TX_I[4] | DQ[2] |
| 33 | TX1P | BYP_TX_I[3] | BSEMSE |
| 34 | RX1N | BYP_TX_I[2] | PORT_BUF_ADDR 0 |
| 35 | TX0P | BYP_TX_I[1] | DQ |
| 36 | TX0N | BYP_TX_I[0] | DQ |
| 37 | CLK | — | — |

| CLOCK PULSE | A | B | C | J$_A$ | K$_A$ | J$_B$ | K$_B$ | J$_C$ | K$_C$ |
|---|---|---|---|---|---|---|---|---|---|
| 0 | 0 | 0 | 0 | 0 | × | 0 | × | 1 | × |
| 1 | 0 | 0 | 1 | 0 | × | 1 | × | × | 1 |
| 2 | 0 | 1 | 0 | 0 | × | × | 0 | 1 | × |
| 3 | 0 | 1 | 1 | 1 | × | × | 1 | × | 1 |
| 4 | 1 | 0 | 0 | × | 0 | 0 | × | 1 | × |
| 5 | 1 | 0 | 1 | × | 0 | 1 | × | × | 1 |
| 6 | 1 | 1 | 0 | × | 0 | × | 0 | 1 | × |
| 7 | 1 | 1 | 1 | × | 1 | × | 1 | × | 1 |
| 8 | 0 | 0 | 0 | | | | | | |

SEMICONDUCTOR MEMORY DEVICE HAVING A SINGLE INPUT TERMINAL TO SELECT A BUFFER AND METHOD OF TESTING THE SAME

CLAIM FOR PRIORITY

This application is a Divisional of U.S. patent application Ser. No. 11/004,684, filed on Dec. 3, 2004, now pending, which claims priority under 35 USC §119 to Korean Patent Application No. 2003-88109, filed on Dec. 5, 2003, the contents of which are herein incorporated by reference in their entirety for all purposes.

BACKGROUND OF THE INVENTION

1. Field of the Invention

The invention relates to a semiconductor memory device having a single input terminal to select a buffer and a method of testing the same.

2. Description of the Related Art

Multi-port memory having a plurality of ports generally includes four to eight ports. Each of the ports of multi-port memory operates independently. The multi-port memory may be available for data access to a core array via a port buffer. Therefore, during a column read/write operation, port buffer address information is required. In addition, during the column read operation, the port buffer address information is required to determine a port buffer where the data from a core array may be stored. During the column write operation, the port buffer address information is required to determine a port buffer whose data may be used.

As described above, during a test mode, the multi-port memory requires a number of information pieces, such as array information and port address information. However, only one piece of information may be transmitted through a pin in the test mode, and the pin operates at low frequency. Therefore, numerous pins are required in the test mode to transmit the information, thereby decreasing an efficiency of the pins. Hence, there is a need for a semiconductor memory device and a method of testing the same that are capable of increasing the efficiency of the pin.

SUMMARY OF THE INVENTION

An exemplary embodiment of the invention is directed to a semiconductor memory device having a single input terminal to select a buffer.

The semiconductor memory device includes a plurality of input-output terminals, a plurality of input-output buffers, a memory core and a buffer selecting unit. The plurality of input-output terminals includes address input terminals, data input-output terminals and an input terminal to select a buffer. The plurality of input-output buffers is coupled to the data input-output terminals, respectively. The memory core is coupled to the input-output buffers through a plurality of input-output lines. The buffer selecting unit generates a parallel buffer select signal based on an expected signal having a pulse stream, wherein the expected signal is provided via the input terminal to select a buffer in a test mode and the parallel buffer select signal corresponds to a respective pulse of the pulse stream, and the buffer selecting unit applies the parallel buffer select signal to the input-output buffers to select a corresponding input-output buffer.

Another exemplary embodiment of the invention is directed to a semiconductor memory device having a single input terminal to select a buffer.

The semiconductor memory device includes a plurality of input-output terminals, a plurality of input-output buffer units, a memory core and a buffer selecting unit. The plurality of input-output terminals includes address input terminals, data input-output terminals and an input terminal to select a buffer. The plurality of input-output buffer units is coupled to the data input-output terminals respectively. The memory core is coupled to the input-output buffer units through a plurality of input-output lines. The buffer selecting unit generates a buffer select signal to select predetermined buffer units from the input-output buffer units in a test mode based on an expected signal from the input terminal to select a buffer.

Another exemplary embodiment of the invention is directed to a method of testing a semiconductor memory device.

In the method, a semiconductor memory test device is programmed so as to perform a test operation. An expected signal is provided through a first input-output terminal according to the programming. An input-output buffer unit is selected from a plurality of input-output buffer units based on the expected signal. Test data is provided from the semiconductor memory test device to the selected input-output buffer unit through a second input-output terminal according to the programming. The provided test data are written in a memory core of the semiconductor memory device. The written test data are read. Whether the semiconductor memory device has a defect is discriminated based on a comparison of the provided test data and the read test data.

Another exemplary embodiment of the invention is directed to a method of testing a semiconductor memory device.

In the method, a semiconductor memory test device is programmed so as to perform a test operation. An expected signal is provided through a first input-output terminal according to the programming. Predetermined input-output buffer units are selected from a plurality of input-output buffer units based on the expected signal. Test data are provided from the semiconductor memory test device to the selected input-output buffer units through second input-output terminals according to the programming. The provided test data are written in a memory core of a semiconductor memory device. The written test data are read. Whether the semiconductor memory device has a defect is discriminated based on a comparison of the provided test data and the read test data.

BRIEF DESCRIPTION OF THE DRAWINGS

The invention will become more apparent to those of ordinary skill in the art by describing, in detail, exemplary embodiments thereof with reference to the attached drawings, wherein like elements are represented by like reference numerals, which are given by way of illustration only and thus do not limit the exemplary embodiments of the invention.

FIG. 4 is an exemplary table representing a pin assignment in a test mode of the semiconductor memory device according to an exemplary embodiment of the invention.

DESCRIPTION OF THE EXEMPLARY EMBODIMENTS

Figure 1:
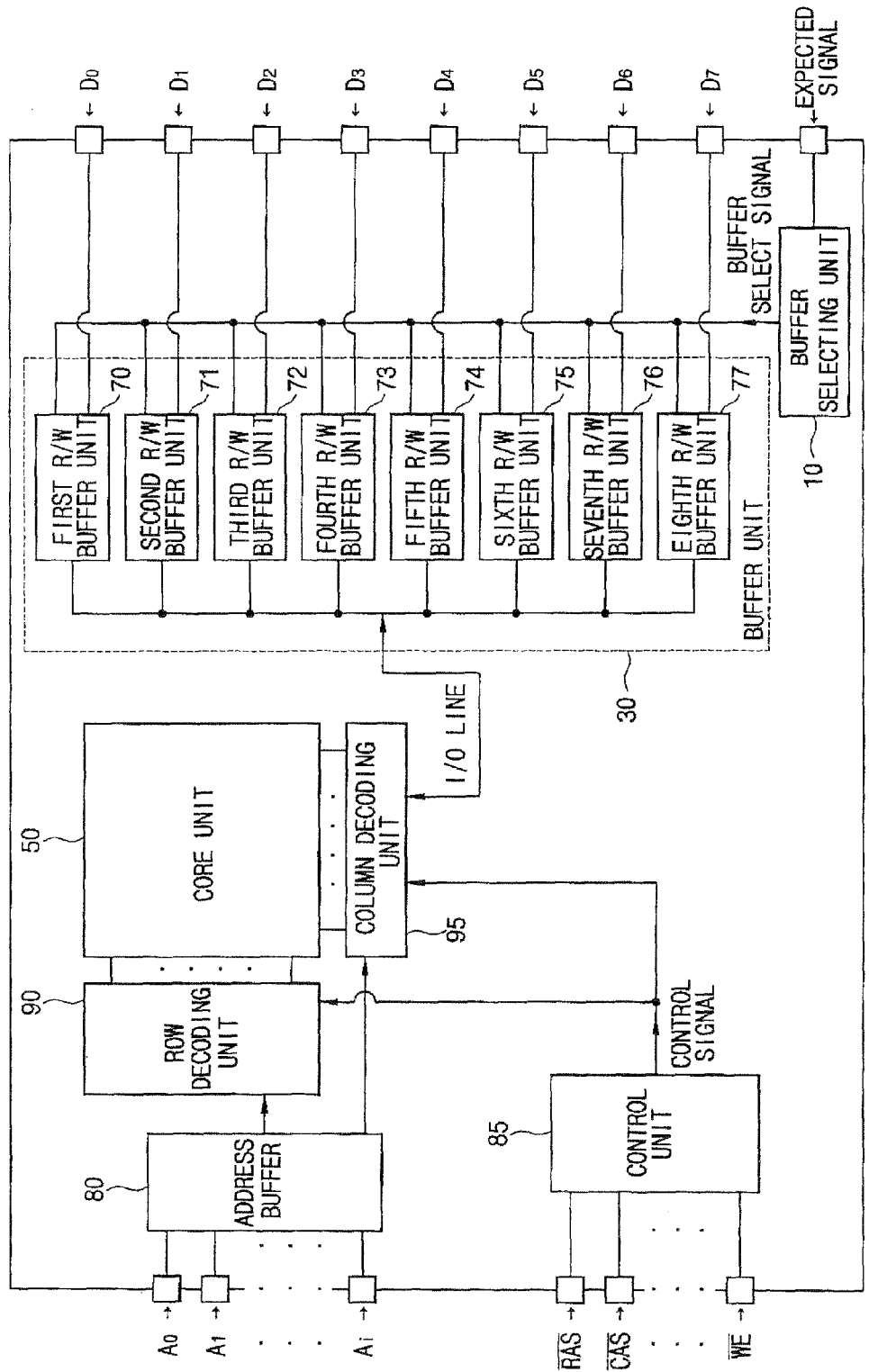
FIG. 1 is an exemplary block diagram illustrating a semiconductor memory device according to an exemplary embodiment of the invention.

FIG. 1 is an exemplary block diagram illustrating a semiconductor memory device according to an exemplary embodiment of the invention.

Referring to FIG. 1, the semiconductor memory device of the invention includes a buffer selecting unit 10, a buffer unit 30, a core unit 50, an address buffer 80, a control unit 85, a row decoding unit 90, and a column decoding unit 95. The semiconductor memory device according to an exemplary embodiment of the invention is a multi-port memory. That is, the semiconductor memory device is connected to multiple ports. In general, the multiple ports may include four to eight ports. Each of the ports operates independently. Each port has an equal number of pins according to an exemplary embodiment of the invention.

The semiconductor memory device of the invention may operate in a normal mode or in a test mode. The semiconductor memory device performs a general DRAM operation in the normal mode, whereas the semiconductor memory device is under test in the test mode.

Hereinafter, an operation of the semiconductor memory device in the test mode will be described.

The buffer selecting unit 10 generates a buffer select signal to select a buffer based on an expected signal provided from a semiconductor memory test device. The expected signal is provided through a contact pad before a packaging process, and provided through a buffer select pin after the packaging process.

The semiconductor memory test device is programmed so as to perform a test operation for the semiconductor memory device. According to the program, the expected signal is provided to a buffer selecting unit 10 through an external buffer select pin or one contact pad. The expected signal according to an exemplary embodiment of the invention has a series of data pulses, which are buffer select signals.

The buffer unit 30 includes a plurality of R/W buffer units (read/write buffers) 70, 71, 72, 73, 74, 75, 76 and 77. At least one R/W buffer unit from the R/W buffer units is selected in response to the buffer select signal. The semiconductor memory test device uses the at least one selected R/W buffer unit to test the semiconductor memory device. Particularly, by the semiconductor memory test device, test data are written to the core unit 50 through the at least one selected R/W buffer unit, and the written test data are read through the at least one selected R/W buffer unit. Hereinafter, the test data written to the core unit via the at least one selected R/W buffer unit are referred to as first test data. In addition, the read test data are referred to as second test data.

According to an exemplary embodiment of the invention, the first test data may be provided from the semiconductor memory test device to the selected R/W buffer units through data input-output pins (DQ pins). In addition, the first test data may be provided through the buffer select pin after a predetermined time from the time the expected signal has been provided.

The core unit 50 includes a plurality of cell arrays, wherein each of the plurality of cell arrays has a plurality of cells. The core unit 50 stores the first test data provided from the selected R/W buffer units in the cells of the cell array.

The address buffer 80 converts address signals provided through external address pins from TTL level to CMOS level, and provides the converted address signals to a row decoding unit 90 and a column decoding unit 95.

The control unit 85 generates internal commands having CMOS levels based on externally-provided $\overline{CAS}$ signal, $\overline{RAS}$ signal and $\overline{WE}$ signal, etc. having TTL levels. In addition, the control unit 85 provides the internal commands to the row decoding unit 90 and the column decoding unit 95.

The row decoding unit 90 selects one of X addresses of the core unit 50 based on the converted address signals and the internal commands. Particularly, the row decoding unit 90 latches the internal commands to generate first latch signals. The row decoding unit 90 performs the row pre-decoding of the first latch signals, and then performs the main row decoding thereof.

The column decoding section 95 selects one of Y addresses of the core unit 50 based on the converted address signals and the internal commands. As a result, a cell is selected from the plurality of cells of the core unit 50. The column decoding unit 95 latches the converted address signal and the internal commands to generate second latch signals. Next, the column decoding unit 95 performs the column pre-decoding of the second latch signals, and then performs the main column decoding thereof. In addition, the column decoding unit 95 is connected to the buffer unit 30 through input/output lines. That is, the first test data in the semiconductor memory test device is written on the cell selected by the row decoding unit 90 and the column decoding unit 95.

In a test mode, the semiconductor memory test device uses one buffer select pin to test the R/W buffer units, so that efficiency of the pin is improved.

Figure 2:
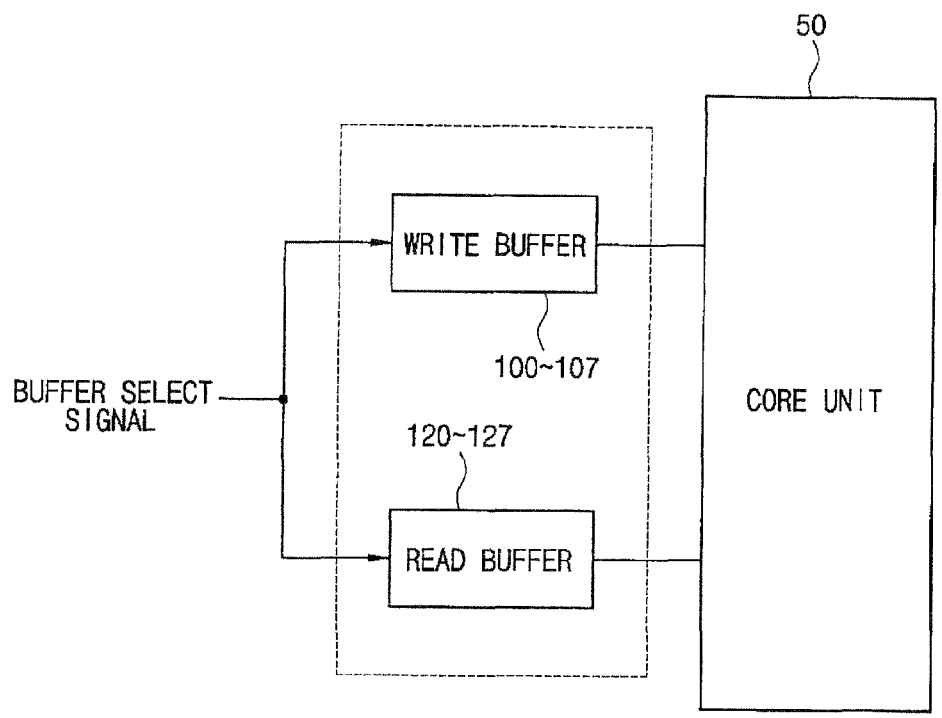
FIG. 2 is an exemplary block diagram illustrating a Read/Write buffer unit according to an exemplary embodiment of the invention.

FIG. 2 is an exemplary block diagram illustrating a Read/Write buffer unit according to an exemplary embodiment of the invention.

Referring to FIG. 2, R/W buffer units 70, 71, 72, 73, 74, 75, 76, and 77 include write buffers 100, 101, 102, 103, 104, 105, 106, and 107 and read buffers 120, 121, 122, 123, 124, 125, 126, and 127, respectively. In the multi-port semiconductor memory device according to an exemplary embodiment of the invention, a write buffer and a read buffer together correspond to one same port.

The semiconductor memory test device tests whether the semiconductor memory device has a defect using a write buffer and a read buffer that are corresponding to the same port.

Figure 3:
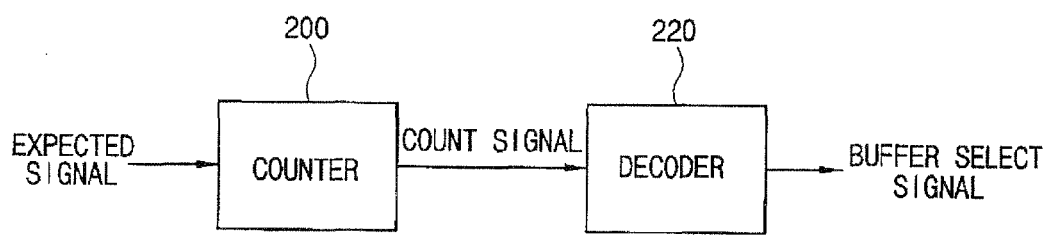
FIG. 3 is an exemplary block diagram illustrating a buffer selecting unit according to an exemplary embodiment of the invention.

FIG. 3 is an exemplary block diagram illustrating a buffer selecting unit according to an exemplary embodiment of the invention.

Referring to FIG. 3, the buffer selecting unit 10 includes a counter 200 and a decoder 220.

The counter 200 receives the expected signal, thereby generating a count signal having binary data based on the received expected signal. For example, the counter 200 generates the count signal having a 3 bit binary data based on the expected signal having a series of data pulses.

The decoder 220 decodes the count signal to generate the buffer select signal. For example, the decoder 220 generates the buffer select signal to select at least one R/W buffer unit among eight R/W buffer units 70, 71, 72, 73, 74, 75, 76 and 77 based on the count signal having the 3 bit binary data. Particularly, a first R/W buffer unit 70 is selected in correspondence with binary data "000," and a second R/W buffer unit 71 is selected in correspondence with binary data "001." A third R/W buffer unit 72 is selected in correspondence with binary data "010," and a fourth R/W buffer unit 73 is selected in correspondence with binary data "011." A fifth R/W buffer unit 74 is selected in correspondence with binary data "100," and a sixth R/W buffer unit 75 is selected in correspondence with binary data "101." A seventh R/W buffer unit 76 is selected in correspondence with binary data "110," and an eighth R/W buffer unit 77 is selected in correspondence with binary data "111."

FIG. 4 is an exemplary table representing a pin assignment in a test mode of the semiconductor memory device according to an exemplary embodiment of the invention.

In a conventional method of testing a semiconductor memory device, the R/W buffer units are selected by 34th to 36th pins.

However, referring to FIG. 4, in a method of testing the semiconductor memory device of the invention, the R/W buffer units are selected only by the 34th pin. Hence, a method of testing the semiconductor memory device of the invention may improve efficiency of the pins compared to a conventional method of testing the semiconductor memory device.

Figures 5A, 5B:
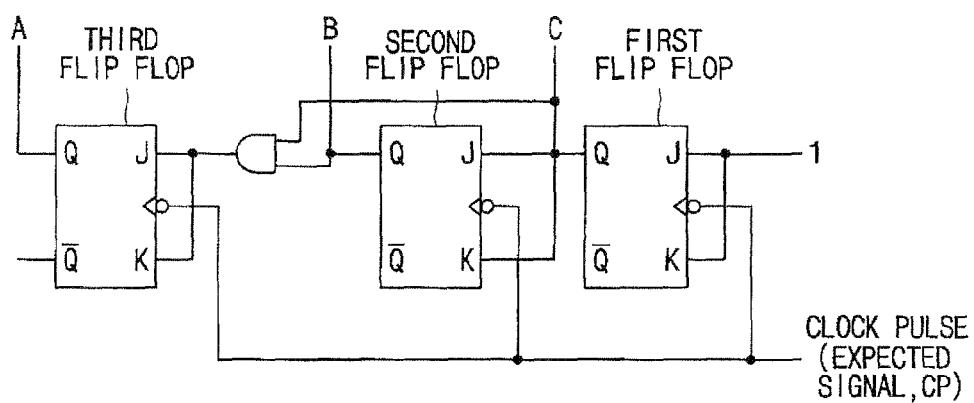
FIG. 5A is an exemplary circuit diagram illustrating an 8-bit counter.
FIG. 5B is a function table of a circuit of the 8-bit counter shown in FIG. 5A.
Figure 5C:
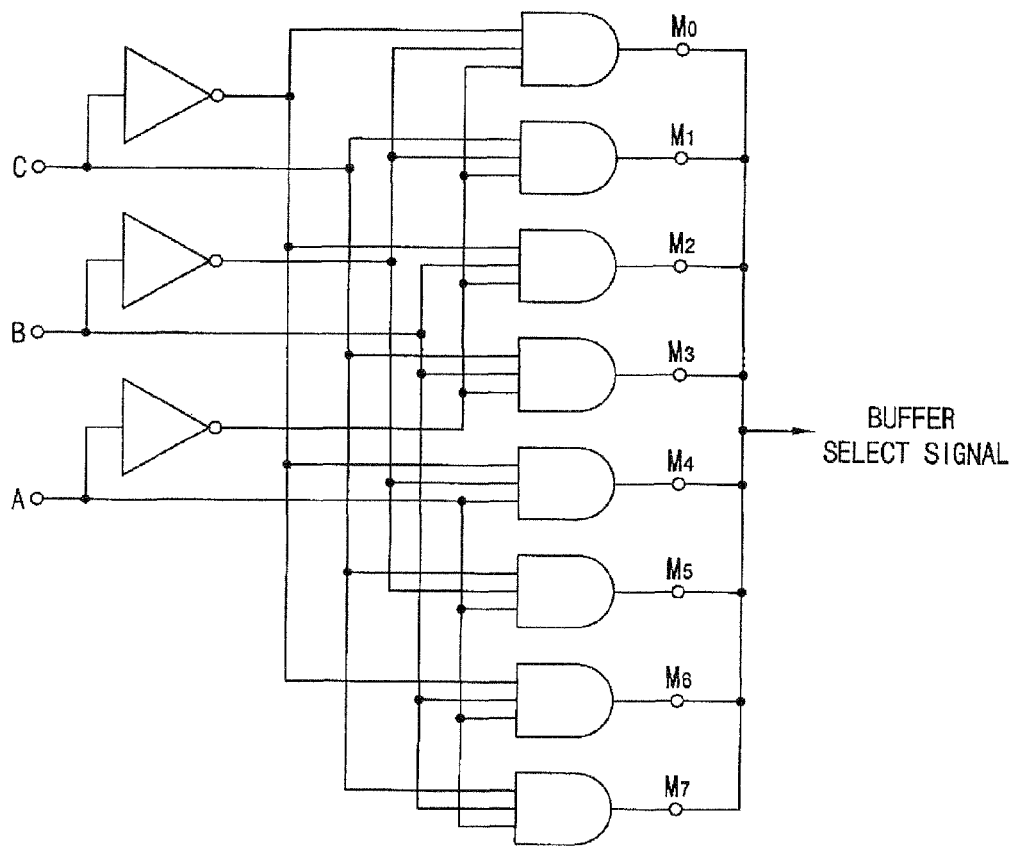
FIG. 5C is an exemplary circuit diagram illustrating a 3×8 decoder.
Figure 5D:
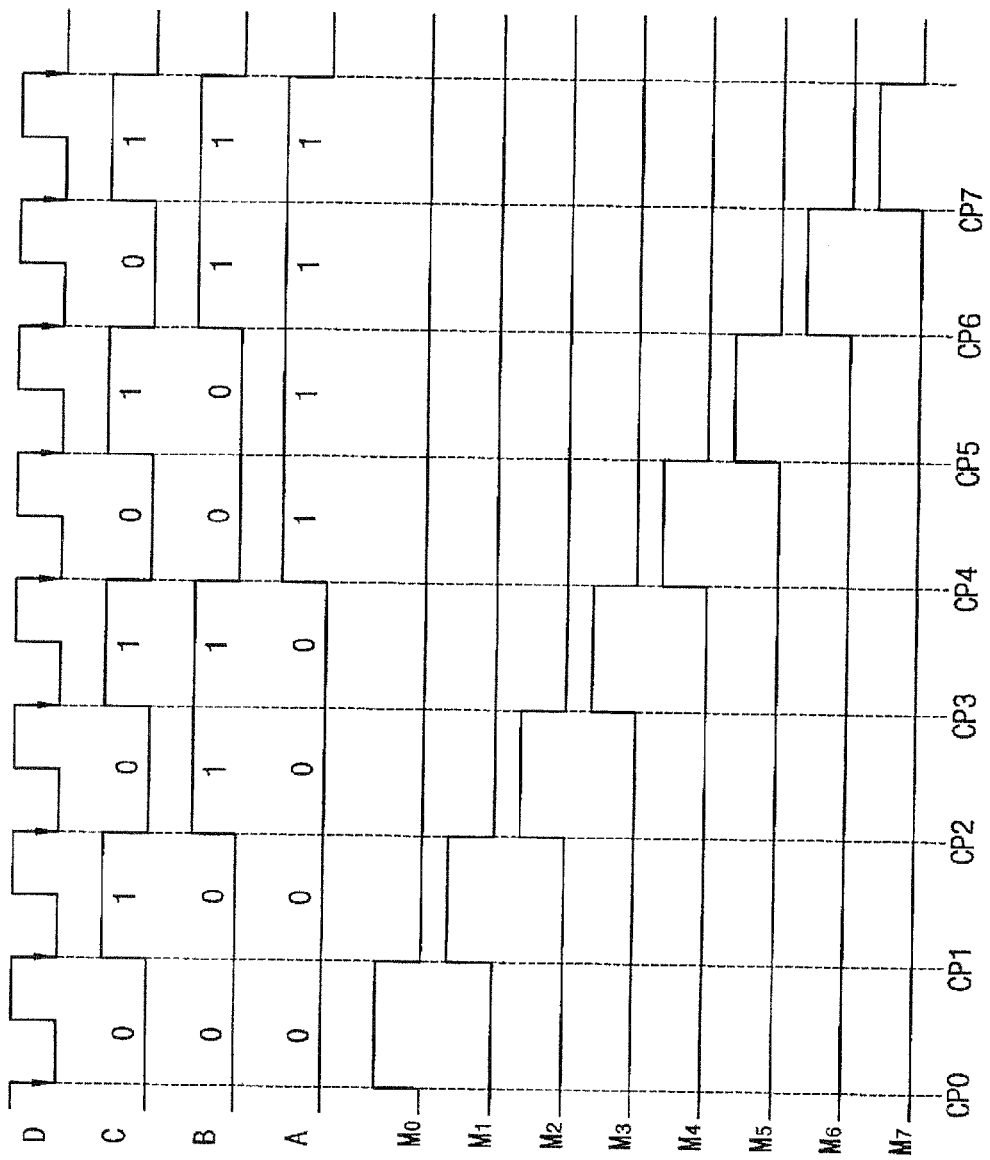
FIG. 5D is an exemplary waveform diagram illustrating operation signals for the counter and decoder based on FIGS. 5A, 5B and 5C.

FIG. 5A is an exemplary circuit diagram illustrating an 8-bit counter, which may be used as in FIG. 3. FIG. 5B is a function table of a circuit of the 8-bit counter shown in FIG. 5A. FIG. 5C is an exemplary circuit diagram illustrating a 3×8 decoder. FIG. 5D is an exemplary waveform diagram illustrating operation signals for the counter and decoder based on FIGS. 5A, 5B and 5C.

Referring to FIGS. 5A through 5D, the counter 200 includes a first flip-flop, a second flip-flop, a third flip-flop and an AND gate. A clock pulse corresponds to the expected signal, and an input of the first flip-flop is "1." An "x" in FIG. 5B means 'don't care.'

An initial binary value of ABC is equal to "000."

In regard of an output (C) of the first flip-flop, the output of the first flip-flop equals "0" at a first clock period CP0. Since the output (C, $Q_t$) of the first flip-flop equals "0" and an input ($J_C$) of the first flip flop equals "1," an output (C, $Q_t+1$) of the first flip flop at a second clock period CP1 equals "1." Since the output (C, $Q_t$) of the first flip-flop equals "1," and an input ($K_C$) of the first flip flop equals "1," an output (C, $Q_t+1$) of the first flip flop at a third clock period CP2 equals "0." Since the output (C, $Q_t$) of the first flip-flop equals "0" and an input ($J_C$) of the first flip flop equals "1," an output (C, $Q_{t+1}$) of the first flip flop at a fourth clock period CP3 equals "1."

At a fifth clock period CP4, since the output (C, $Q_t$) of the first flip-flop equals "1" and an input ($K_C$) of the first flip flop equals "1", an output (C, $Q_{t+1}$) of the first flip flop equals "0." At a sixth clock period CP5, since the output (C, $Q_t$) of the first flip-flop equals "0" and an input ($J_C$) of the first flip flop equals "1," an output (C, $Q_{t+1}$) of the first flip flop equals "1." At a seventh clock period CP6, since the output (C, $Q_t$) of the first flip-flop equals "1" and an input ($K_C$) of the first flip flop equals "1," an output (C, $Q_{t+1}$) of the first flip flop equals "0."

At an eighth clock period CP7, since the output (C, $Q_t$) of the first flip-flop equals "0" and an input ($J_C$) of the first flip flop equals "1," an output (C, $Q_{t+1}$) of the first flip flop equals "1."

In regard of an output (B) of the second flip-flop, the output (B) of the second flip-flop equals "0" at the first clock period CP0. At the second clock period CP1, since the output (B) of the second flip-flop at the first clock period CP0 maintains, the output (B) of the second flip flop equals "1." At the third clock period CP2, since the output (B, $Q_t$) of the second flip-flop equals "0" and an input ($J_B$) of the second flip lop equals "1," an output (B, $Q_{t+1}$) of the second flip flop equals "1." At a fourth clock period CP3, since the output (B) of the second flip-flop at the third clock period CP2 maintains, the output (B) of the second flip flop equals "1." At the fifth clock period CP4, since the output (B, $Q_t$) of the second flip-flop equals "1" and an input (KB) of the second flip flop equals "1," an output (B, $Q_{t+1}$) of the second flip flop equals "0." At the sixth clock period CP5, since the output (B) of the second flip-flop at the fifth clock period CP4 maintains, the output (B) of the second flip flop equals "0." At the seventh clock period CP6, since the output (B, $Q_t$) of the second flip-flop equals "0" and an input ($J_B$) of the second flip flop equals "1," an output (B, $Q_{t+1}$) of the second flip flop equals "1." At the eighth clock period CP7, since the output (B) of the second flip-flop at the seventh clock period CP6 maintains, an output (B) of the second flip flop equals "1.", In regard of an output (A) of the third flip-flop, the output (A) of the third flip-flop equals "0" at the first clock period CP0. During a time period from the second clock period CP1 to the fourth clock period CP3, the output (A) of the third flip-flop at the first clock period CP0 maintains so that the output (A) of the third flip flop equals "0." At the fifth clock period CP4, since both the output (C) of the first flip-flop and an output (B) of the second flip flop are equal to "1," an input (JA) of the third flip flop equals "1." In addition, since the output (A, $Q_t$) of the third flip-flop equals "0" and an input ($J_A$) of the third flip flop equals "1," an output (A, $Q_{t+1}$) of the third flip flop equals "1." During a time period from the sixth clock period CP5 to the eighth clock period CP7, the output (A) of the third flip-flop at the fifth clock period CP4 maintains so that the output (A) of the third flip flop equals "1."

As illustrated above, the output of the counter 200 (ABC) has binary data of "000," "001," "010," "011," "100," "101," "110," and "111" as shown in FIG. 5D.

Referring to FIGS. 5C and 5D, A,' B,' and C' refer to the logical compliment of A, B, and C, respectively, as follows: M0 corresponds to A'B'C,' M1 corresponds to A'B'C, M2 corresponds to A'BC,' M3 corresponds to A'BC, M4 corresponds to AB'C,' M5 corresponds to AB'C, M6 corresponds to ABC,' and M7 corresponds to ABC.

When a value of ABC is equal to "000," a value of M0 is equal to "1," and values of M1 to M7 are equal to "0." That is, the first R/W buffer unit 70 is selected in response to the buffer select signal.

When the value of ABC is equal to "001," a value of M1 is equal to "1," and values of M0 and M2 to M7 are equal to "0." That is, the second R/W buffer unit 71 is selected in response to the buffer select signal.

When the value of ABC is equal to "010," a value of M2 is equal to "1," and values of M0, M1 and M3 to M7 are equal to "0." That is, the third R/W buffer unit 72 is selected in response to the buffer select signal.

When the value of ABC is equal to "011," a value of M3 is equal to "1," and values of M0 to M2, and M4 to M7 are equal to "0." That is, the fourth R/W buffer unit 73 is selected in response to the buffer select signal.

When the value of ABC is equal to "100," a value of M4 is equal to "1," and values of M0 to M3, and M5 to M7 are equal to "0." That is, the fifth R/W buffer unit 74 is selected in response to the buffer select signal.

When the value of ABC is equal to "101," a value of M5 is equal to "1," and values of M0 to M4, M6 and M7 are equal to "0." That is, the sixth R/W buffer unit 75 is selected in response to the buffer select signal.

When the value of ABC is equal to "110," a value of M6 is equal to "1," and values of M0 to M5, and M7 are equal to "0." That is, the seventh R/W buffer unit 76 is selected in response to the buffer select signal.

Figure 6:
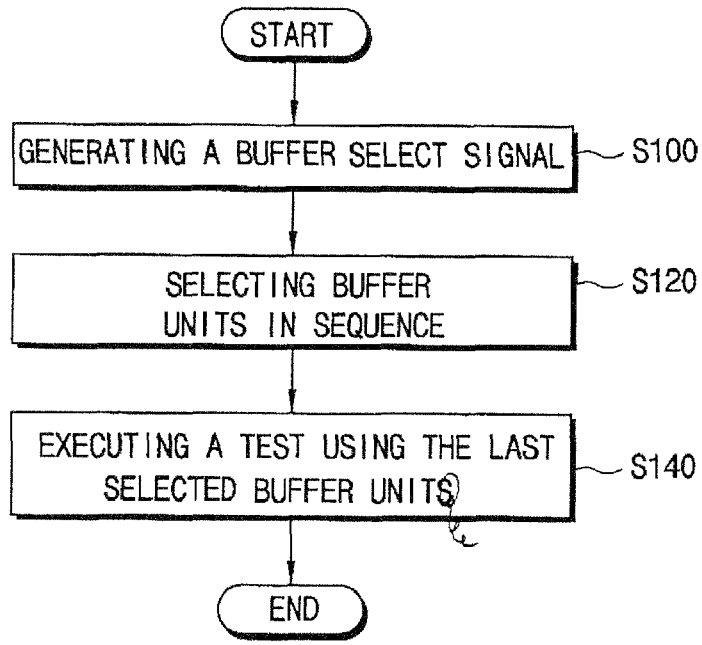
FIG. 6 is an exemplary flowchart illustrating a method of testing the semiconductor memory device according to an exemplary embodiment of the invention.

When the value of ABC is equal to "111," a value of M7 is equal to "1," and values of M0 to M6 are equal to "0." That is, the eighth R/W buffer unit 77 is selected in response to the buffer select signal, FIG. 6 is an exemplary flowchart illustrating a method of testing the semiconductor memory device according to an exemplary embodiment of the invention.

Referring to FIG. 6, the buffer selecting unit 10 generates the buffer select signal based on the expected signal (step S100). The R/W buffer units 70 to 77 are sequentially selected in response to the buffer select signal (step S120). For example, when a value of ABC is equal to "011," the first through fourth R/W buffer units are sequentially selected based on the buffer select signal, because the counter 200 outputs "000," "001," "010" and "011" in sequence.

The semiconductor memory device is tested using the last selected R/W buffer unit among the sequentially selected R/W buffer units (step S140). For example, when the value of ABC equals "011," the semiconductor memory device is tested using the fourth R/W buffer unit 73 selected in response to a buffer select signal corresponding to "011."

Figure 7:
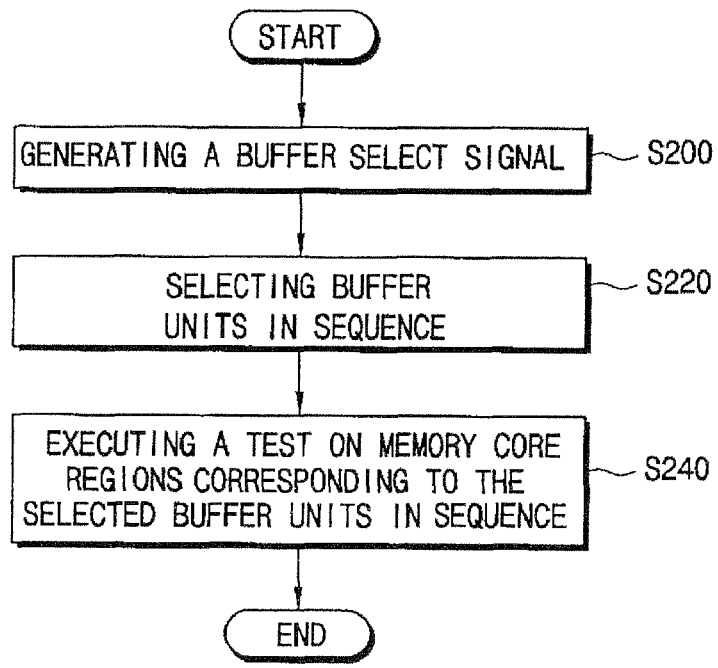
FIG. 7 is an exemplary flowchart illustrating a method of testing the semiconductor memory device according to another exemplary embodiment of the invention.

FIG. 7 is an exemplary flowchart illustrating a method of testing the semiconductor memory device according to another exemplary embodiment of the invention.

Referring to FIG. 7, the buffer selecting unit 10 generates the buffer select signal based on the expected signal 10 (step S200).

Based on the buffer select signal, predetermined R/W buffer units among the R/W buffer units 70 through 77 are sequentially selected based on the buffer select signal. The respective regions of the core unit 50 are sequentially tested corresponding to the selected R/W buffer units (step S240).

For example, when the value of ABC equals "011," first to fourth R/W buffer units 70~73 are sequentially selected based on the buffer select signal.

Continuing with this example, it is tested whether or not a first storage region of the core unit 50 has a defect using the first R/W buffer unit 70 that corresponds to the binary value '000.' It is tested whether a second storage region of the core unit 50 has the defect using the second R/W buffer unit 71 that corresponds to the binary value '001.' It is tested whether a third storage region of the core unit 50 has the defect using the third R/W buffer unit 72 that corresponds to the binary value '010.' In addition, it is tested whether a fourth storage region of the core unit 50 has the defect using the fourth R/W buffer unit 73 that corresponds to the binary value '011.' Of course, the respective storage regions may correspond to the entire region of the core unit 50. It is noted that this modification does not affect the scope of the invention to those skilled in the art.

Figure 8:
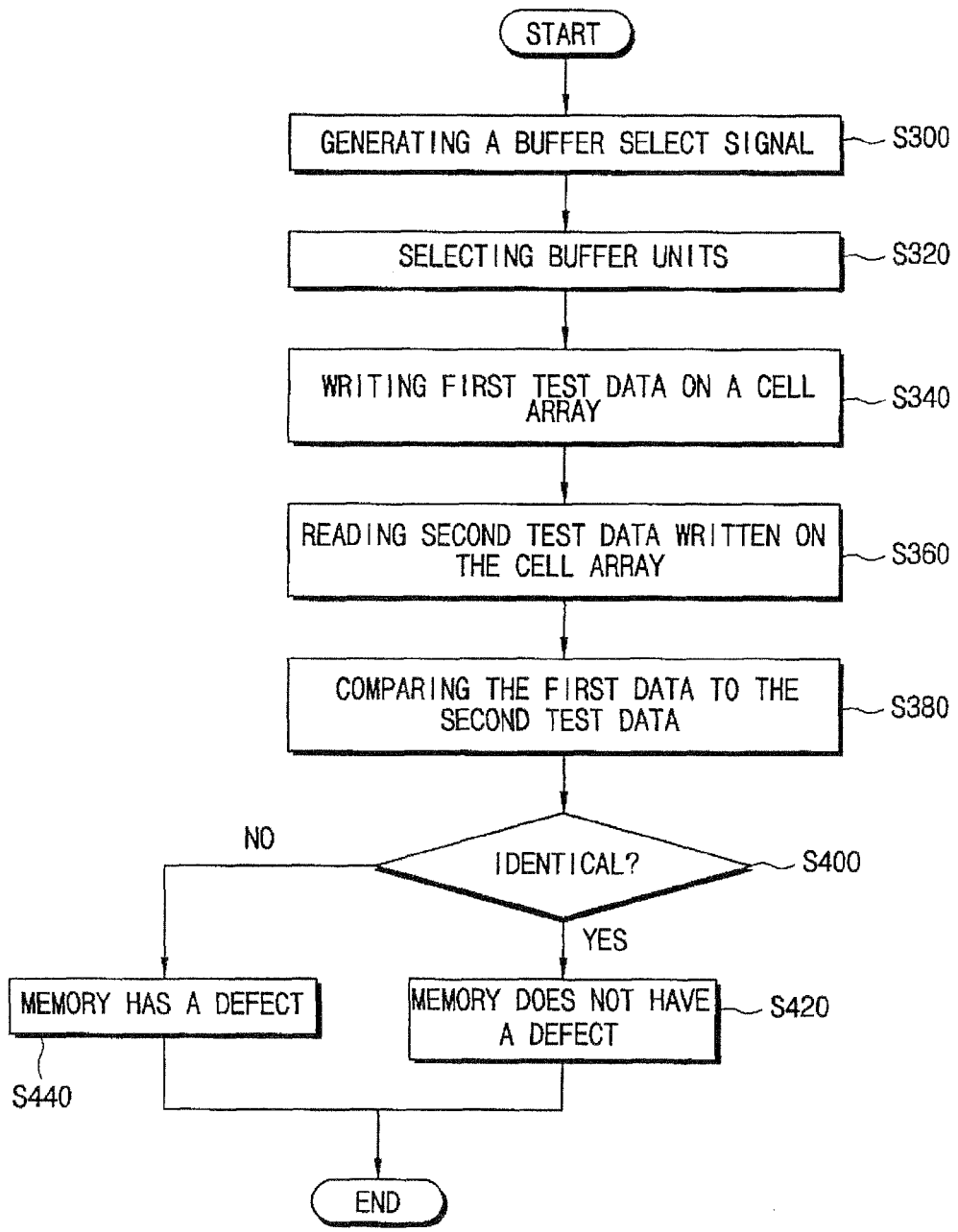
FIG. 8 is an exemplary flowchart illustrating a method of testing the semiconductor memory device according to still another exemplary embodiment of the invention.

FIG. 8 is an exemplary flowchart illustrating a method of testing a semiconductor memory device according to yet another exemplary embodiment of the invention.

Referring to FIG. 8, the buffer selecting unit 10 generates the buffer select signal based on the expected signal (step S300). The R/W buffer unit is selected in response to the buffer select signal (step S320). The first test data stored in the selected R/W buffer unit are written into the core unit 50 (step S340). The second test data written into the core unit 50 are read out from the core unit 50 (step S360). The first test data stored in the selected R/W buffer unit is compared to the second test data read from the core unit 50 (step S380). Whether the first test data are equal to the second test data is discriminated (step S400). When the first test data are equal to the second test data, the semiconductor memory device is discriminated to be normal without the defect (step S420). When the first test data are not equal to the second test data, the semiconductor memory device is discriminated to be defective (step S440).

Figure 9:
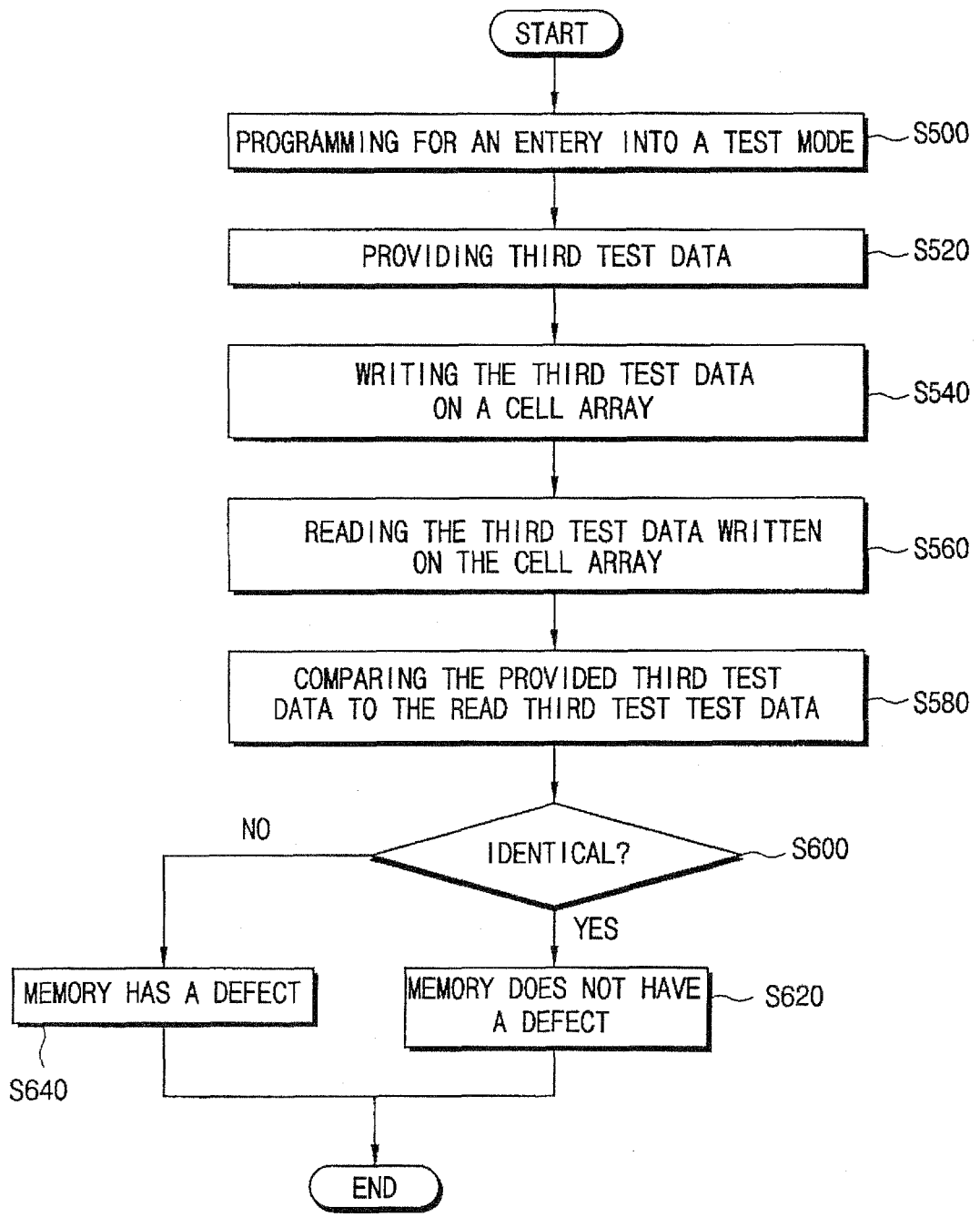
FIG. 9 is an exemplary flowchart illustrating a method of testing the semiconductor memory device according to yet another exemplary embodiment of the invention.

FIG. 9 is an exemplary flowchart illustrating a method of testing the semiconductor memory device according to still another exemplary embodiment of the invention.

Referring to FIG. 9, the semiconductor memory test device is programmed to perform the test operation (step S500). The semiconductor memory device is set according to the program. The semiconductor memory test device provides third test data via the buffer select pin or the data input-output pin (step S520). The provided third test data are written into the core unit (step S540). The written third test data are read from the core unit (step S560). The provided third test data are compared to the read third test data (step S580). Whether the provided test data are equal to the read third test data is discriminated (step S600). When the provided test data are equal to the read third test data, the semiconductor memory device is discriminated to be normal without the defect (step S620). When the provided third test data are not equal to the read third test data, the semiconductor memory device is discriminated to be defective (step S640).

According to the invention, the R/W buffer unit may be selected through an external buffer select pin or one contact pad, thereby increasing the efficiency of the pin in the semiconductor memory device.

Having thus described exemplary embodiments of the invention, it is to be understood that the invention defined by the appended claims is not to be limited by particular details set forth in the above description as many apparent variations thereof are possible without departing from the spirit or scope thereof as hereinafter claimed.

What is claimed is:

1. A method of testing a semiconductor memory device comprising:
   programming a semiconductor memory test device to perform a test operation;
   providing an expected signal through a first input-output terminal according to the programming;
   selecting an input-output buffer unit from a plurality of input-output buffer units based on the expected signal;
   providing test data from the semiconductor memory test device to the selected input-output buffer unit through a second input-output terminal according to the programming;
   writing the provided test data in a memory core of the semiconductor memory device;
   reading the written test data; and
   discriminating whether the semiconductor memory device has a defect based on a comparison of the provided test data and the read test data.

2. The method of claim 1, wherein the selecting an input-output buffer unit includes: generating a count signal having binary data based on the expected signal; and decoding the count signal.

3. The method of claim 1, wherein the first input-output terminal corresponds to a pin to select the input-output buffer unit, and the second input-output terminal corresponds to a pin to input and/or output data.

4. The method of claim 1, wherein the first input-output terminal is equal to the second input-output terminal.

5. The method of claim 4, wherein the test data are provided to the selected input-output buffer unit through the first input-output terminal a predetermined time after the expected signal is provided through the first input-output terminal in the test mode.

6. The method of claim 1, wherein each of the input-output buffer units includes: an input buffer configured to write the test data in the memory core; and an output buffer configured to read the written test data in the memory core.

7. The method of claim 6, wherein when a semiconductor memory device having multiple ports is under the test operation, the input buffer and the output buffer corresponding to the input buffer are coupled together to a same port.

8. The method of claim 1, wherein the memory core includes a plurality of array cells.

9. The method of claim 8, wherein the test data are written in sequence on the array cells according to the input-output buffer units that are selected in sequence.

10. The method of claim 9, wherein the test data written in sequence are read in sequence.

11. The method of claim 1, wherein the semiconductor memory test device repeats testing the semiconductor memory device according to the selected input-output buffer unit.

* * * * *